(12) United States Patent
Fukuda (10) Patent No.: US 11,804,559 B2
(45) Date of Patent: Oct. 31, 2023

(54) SOLAR CELL MODULE AND METHOD FOR MANUFACTURING SOLAR CELL MODULE

(71) Applicant: KANEKA CORPORATION, Osaka (JP)

(72) Inventor: Masanori Fukuda, Hyogo (JP)

(73) Assignee: KANEKA CORPORATION, Osaka (JP)

(*) Notice: Subject to any disclaimer, the term of this patent is extended or adjusted under 35 U.S.C. 154(b) by 0 days.

(21) Appl. No.: 16/627,648

(22) PCT Filed: May 29, 2018

(86) PCT No.: PCT/JP2018/020597
§ 371 (c)(1),
(2) Date: Dec. 30, 2019

(87) PCT Pub. No.: WO2019/003769
PCT Pub. Date: Jan. 3, 2019

(65) Prior Publication Data
US 2021/0119067 A1    Apr. 22, 2021

(30) Foreign Application Priority Data
Jun. 29, 2017  (JP) .................................. 2017-127033

(51) Int. Cl.
*H01L 31/0224*    (2006.01)
*H01L 31/02*       (2006.01)
(Continued)

(52) U.S. Cl.
CPC .. *H01L 31/022425* (2013.01); *H01L 31/0201* (2013.01); *H01L 31/022433* (2013.01);
(Continued)

(58) Field of Classification Search
CPC ......... H01L 31/0201; H01L 31/022425; H01L 31/022433; H01L 31/05–0516; H01L 31/022466; H01L 31/03762
See application file for complete search history.

(56) References Cited

U.S. PATENT DOCUMENTS

2004/0112423 A1* 6/2004 Suzuki ............ H01L 31/022425
136/256
2009/0032081 A1* 2/2009 Saita ................... H01L 31/0508
136/244
(Continued)

FOREIGN PATENT DOCUMENTS

JP    2012182168 A    9/2012
JP    2013507781 A    3/2013
(Continued)

OTHER PUBLICATIONS

English machine translation of JP 2016-72495A. (Year: 2016).*
(Continued)

*Primary Examiner* — Lindsey A Buck
(74) *Attorney, Agent, or Firm* — Osha Bergman Watanabe & Burton LLP (57) ABSTRACT

A solar cell module according to the present disclosure includes a photoelectric converter, a collector electrode electrically connected to the photoelectric converter, and a wiring material (3) electrically connected to the collector electrode, wherein the collector electrode includes: a first electrode film (9A) formed on a photoelectric converter side; and a second electrode film (9B) formed on at least a wiring material side of the first electrode film (9A) so that part of a surface of the first electrode film (9A) on the wiring material side is exposed, and wherein the collector electrode
(Continued)

and the wiring material (3) are electrically connected to each other with solder (11) connected to the part of the surface of the first electrode film (9A) exposed from the second electrode film (9B) and to a surface of the second electrode film (9B).

6 Claims, 7 Drawing Sheets

(51) Int. Cl.
  *H01L 31/0376* (2006.01)
  *H01L 31/05* (2014.01)
  *H01L 31/18* (2006.01)

(52) U.S. Cl.
  CPC ............... *H01L 31/022466* (2013.01); *H01L 31/03762* (2013.01); *H01L 31/05* (2013.01); *H01L 31/1884* (2013.01)

(56) References Cited

U.S. PATENT DOCUMENTS

| | | | |
|---|---|---|---|
| 2012/0125396 A1* | 5/2012 | Taira | ............ H01L 31/0201 136/244 |
| 2012/0240998 A1 | 9/2012 | Ballif | |
| 2013/0333743 A1 | 12/2013 | Ishii et al. | |

FOREIGN PATENT DOCUMENTS

| | | |
|---|---|---|
| JP | 2016072495 A | 5/2016 |
| WO | 2017027769 A1 | 2/2017 |

OTHER PUBLICATIONS

International Search Report issued in corresponding International Application No. PCT/JP2018/020597; dated Aug. 14, 2018 (6 pages).

Written Opinion of the International Searching Authority issued in corresponding International Application No. PCT/JP2018/020597; dated Aug. 14, 2018 (6 pages).

* cited by examiner

SOLAR CELL MODULE AND METHOD FOR MANUFACTURING SOLAR CELL MODULE

TECHNICAL FIELD

The present invention relates to a solar cell module and a method of manufacturing a solar cell module.

BACKGROUND ART

In Patent Literature 1 described below, there is disclosed a solar cell module including a first solar cell, a second solar cell, and a wiring material configured to electrically connect a bus bar electrode incorporated in the first solar cell and a bus bar electrode incorporated in the second solar cell to each other. In Patent Literature 1 described below, the bus bar electrode incorporated in each solar cell includes a base conductive layer and a plating layer formed on an upper layer of the base conductive layer, and the wiring material and the plating layer are connected to each other with solder.

CITATION LIST

Patent Literature

[PTL 1] JP 2012-182168 A

SUMMARY OF INVENTION

Technical Problem

The related-art solar cell module, however, leaves room for further improvement in connection reliability between the wiring material and the bus bar electrode. Specifically, in the above-mentioned configuration of the related art, the plating layer has a smooth surface, and hence has a small contact area with the solder. Thus, there is room for further improvement in connection reliability between the solder and the bus bar electrode. As a result, there is room for further improvement in connection reliability between the wiring material and the bus bar electrode.

The present disclosure is provided in view of the above-mentioned problems, and an object of the present disclosure is to improve connection reliability between a wiring material and a bus bar electrode.

Solution to Problem (1) According to one embodiment of the present disclosure, there is provided a solar cell module, including: a photoelectric converter; a collector electrode electrically connected to the photoelectric converter; and a wiring material electrically connected to the collector electrode, wherein the collector electrode includes: a first electrode film formed on a photoelectric converter side; and a second electrode film formed on at least a wiring material side of the first electrode film so that part of a surface of the first electrode film on the wiring material side is exposed, and wherein the collector electrode and the wiring material are electrically connected to each other with solder connected to the part of the surface of the first electrode film exposed from the second electrode film and to a surface of the second electrode film.

(2) In the solar cell module according to Item (1), the second electrode film may be partially formed in a plurality of island shapes on the surface of the first electrode film on the wiring material side, and the solder may be connected to the surface of the second electrode film formed in the plurality of island shapes, the surface including a side surface of the second electrode film.

(3) In the solar cell module according to Item (1), the second electrode film may have an opening configured to expose the part of the surface of the first electrode film on at least the wiring material side, and the solder may be connected to an inner surface of the opening.

(4) In the solar cell module according to any one of Items (1) to (3), the surface of the first electrode film on at least the wiring material side may be porous.

(5) In the solar cell module according to any one of Items (1) to (4), the photoelectric converter may include: a semiconductor substrate; anamorphous semiconductor layer formed on a collector electrode side of the semiconductor substrate; and a transparent conductive layer formed on a collector electrode side of the amorphous semiconductor layer.

(6) In the solar cell module according to any one of Items (1) to (5), the photoelectric converter may have formed an insulating film in a surface region thereof on a wiring material side in which the first electrode film is prevented from being formed.

(7) In the solar cell module according to any one of Items (1) to (6), the second electrode film may include a plating electrode.

(8) According to one embodiment of the present disclosure, there is provided a method of manufacturing a solar cell module including a photoelectric converter, a collector electrode electrically connected to the photoelectric converter, and a wiring material electrically connected to the collector electrode, the method including: a photoelectric converter preparing step of preparing the photoelectric converter; a first electrode film forming step of forming a first electrode film on a wiring material side of the photoelectric converter; a second electrode film forming step of forming a second electrode film on at least a wiring material side of the first electrode film so that part of a surface of the first electrode film on at least the wiring material side is exposed; and a wiring material connecting step of electrically connecting the collector electrode and the wiring material to each other with solder by connecting the solder to the part of the surface of the first electrode film exposed from the second electrode film and to a surface of the second electrode film.

(9) In the method of manufacturing a solar cell module according to Item (8), the second electrode film forming step may include partially forming the second electrode film in a plurality of island shapes on the surface of the first electrode film on the wiring material side, and the wiring material connecting step may include connecting the solder to the surface of the second electrode film formed in the plurality of island shapes, the surface including a side surface of the second electrode film.

(10) In the method of manufacturing a solar cell module according to Item (8), the second electrode film forming step may include forming the second electrode film so as to have an opening configured to expose the part of the surface of the first electrode film on at least the wiring material side, and the wiring material connecting step may include connecting the solder to an inner surface of the opening.

(11) In the method of manufacturing a solar cell module according to Item (8), the second electrode film forming step may include the steps of: forming the second electrode film on the wiring material side of the first electrode film; and removing part of the second electrode film to expose the part of the surface of the first electrode film on at least the wiring material side.

(12) In the method of manufacturing a solar cell module according to any one of Items (8) to (11), the first electrode film forming step may include forming the first electrode film by printing a conductive paste.

(13) In the method of manufacturing a solar cell module according to any one of Items (8) to (12), the first electrode film forming step may include bringing a thickness of the first electrode film into a non-uniform state.

(14) In the method of manufacturing a solar cell module according to any one of Items (8) to (13), the second electrode film forming step may include forming the second electrode film by a plating method using the first electrode film as a starting point.

(15) The method of manufacturing a solar cell module according to any one of Items (8) to (14) may further include an insulating film forming step of forming an insulating film in a surface region of the photoelectric converter on a wiring material side in which the first electrode film is prevented from being formed.

DESCRIPTION OF EMBODIMENTS

An embodiment of the present disclosure is described below with reference to the drawings.

[Solar Cell Module 200]

Figure 1:
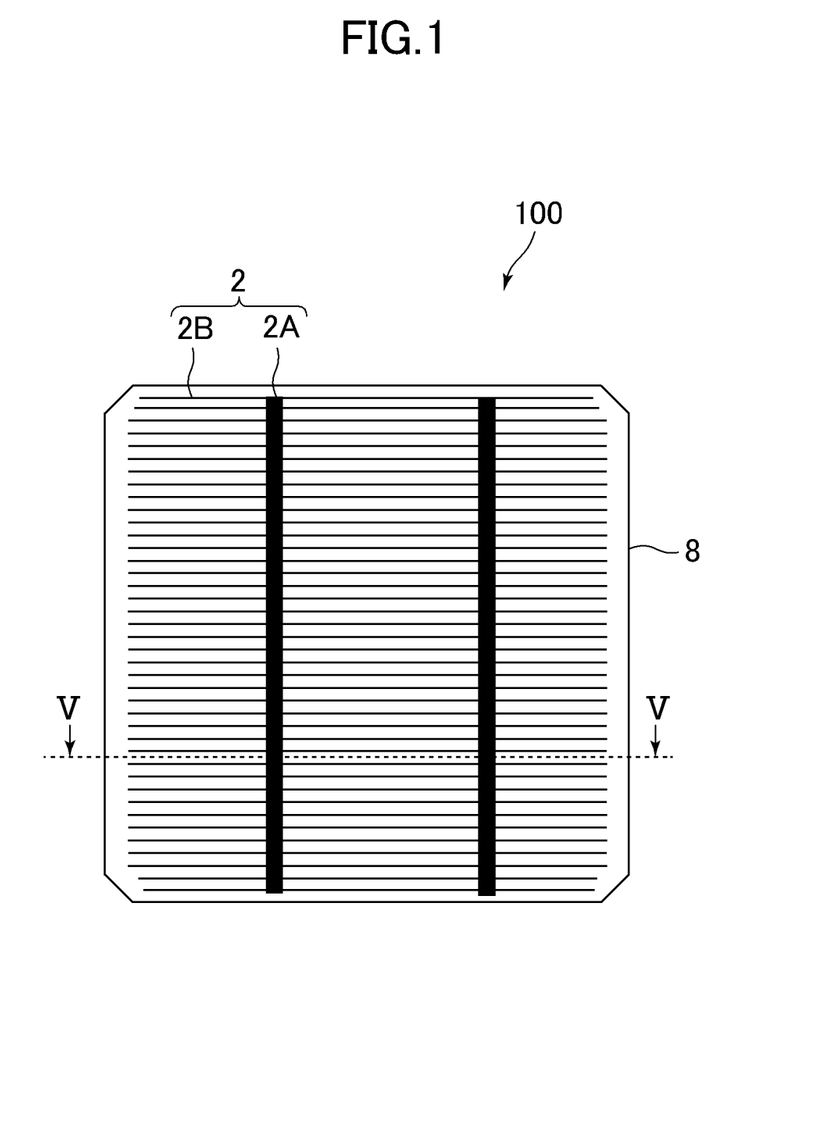
FIG. 1 is a schematic plan view for illustrating a front surface side (incident surface side) of a photo electric conversion element of a solar cell module according to an embodiment of the present disclosure.
Figure 2:
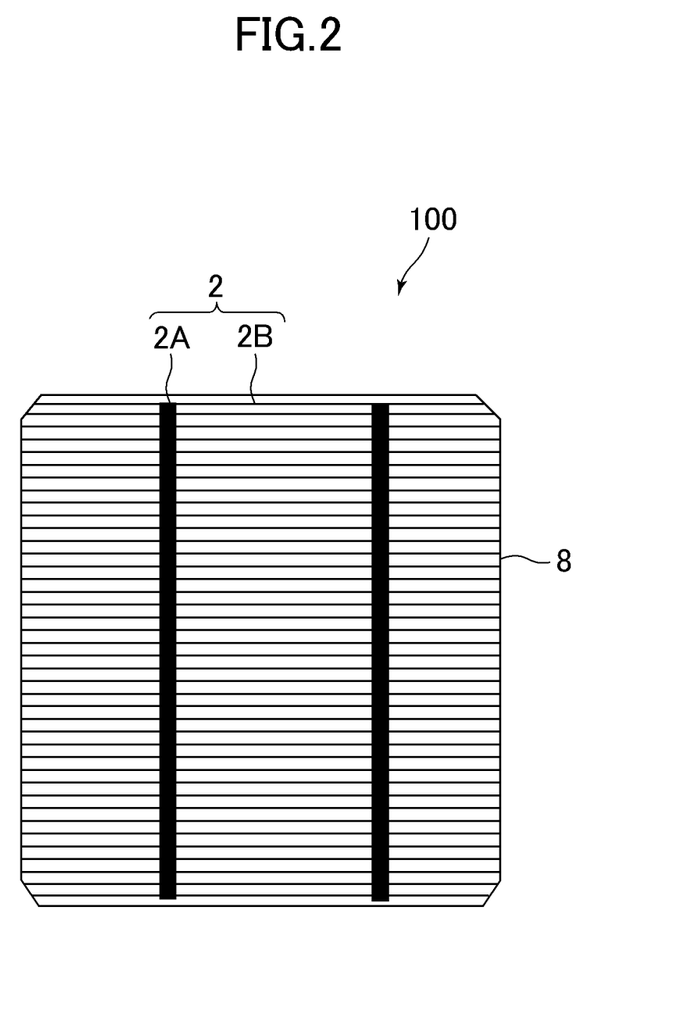
FIG. 2 is a schematic plan view for illustrating a back surface side of the photoelectric conversion element of the solar cell module according to the embodiment.

FIG. 1 is a schematic plan view for illustrating a front surface side (light-receiving surface side) of a photoelectric conversion element 100 incorporated in a solar cell module 200 according to an embodiment of the present disclosure. FIG. 2 is a schematic plan view for illustrating a back surface side of the photoelectric conversion element 100 incorporated in the solar cell module according to this embodiment.

As illustrated in FIG. 1 and FIG. 2, the photoelectric conversion element 100 of this embodiment includes a photoelectric converter 8 and collector electrodes 2 formed on a front surface side and a back surface side of the photoelectric converter 8. Each of the collector electrodes 2 includes: two wide bus bar electrodes 2A substantially parallel to one side of a semiconductor substrate incorporated in the photoelectric converter 8; and a plurality of narrow finger electrodes 2B substantially perpendicular to the bus bar electrodes 2A.

The collector electrode 2 on the front surface side has first polarity, and the collector electrode 2 on the back surface side has opposite polarity to the first polarity. In this embodiment, the collector electrode 2 on the front surface side is a positive electrode, and the collector electrode 2 on the back surface side is a negative electrode.

The bus bar electrodes 2A and the finger electrodes 2B each include a first electrode film formed on the semiconductor substrate and a second electrode film formed through a plating step including using the first electrode film as a starting point. An insulating film is formed in a front surface region and a back surface region of the photoelectric conversion element 100 in which the bus bar electrodes 2A and the finger electrodes 2B are prevented from being formed. It is appropriate to adopt a configuration in which the bus bar electrodes 2A and the finger electrodes 2B are formed only on the front surface side or on the back surface side. In this case, it is also appropriate to adopt a configuration in which the insulating film is also formed only on the front surface side or on the back surface side.

Figure 3:
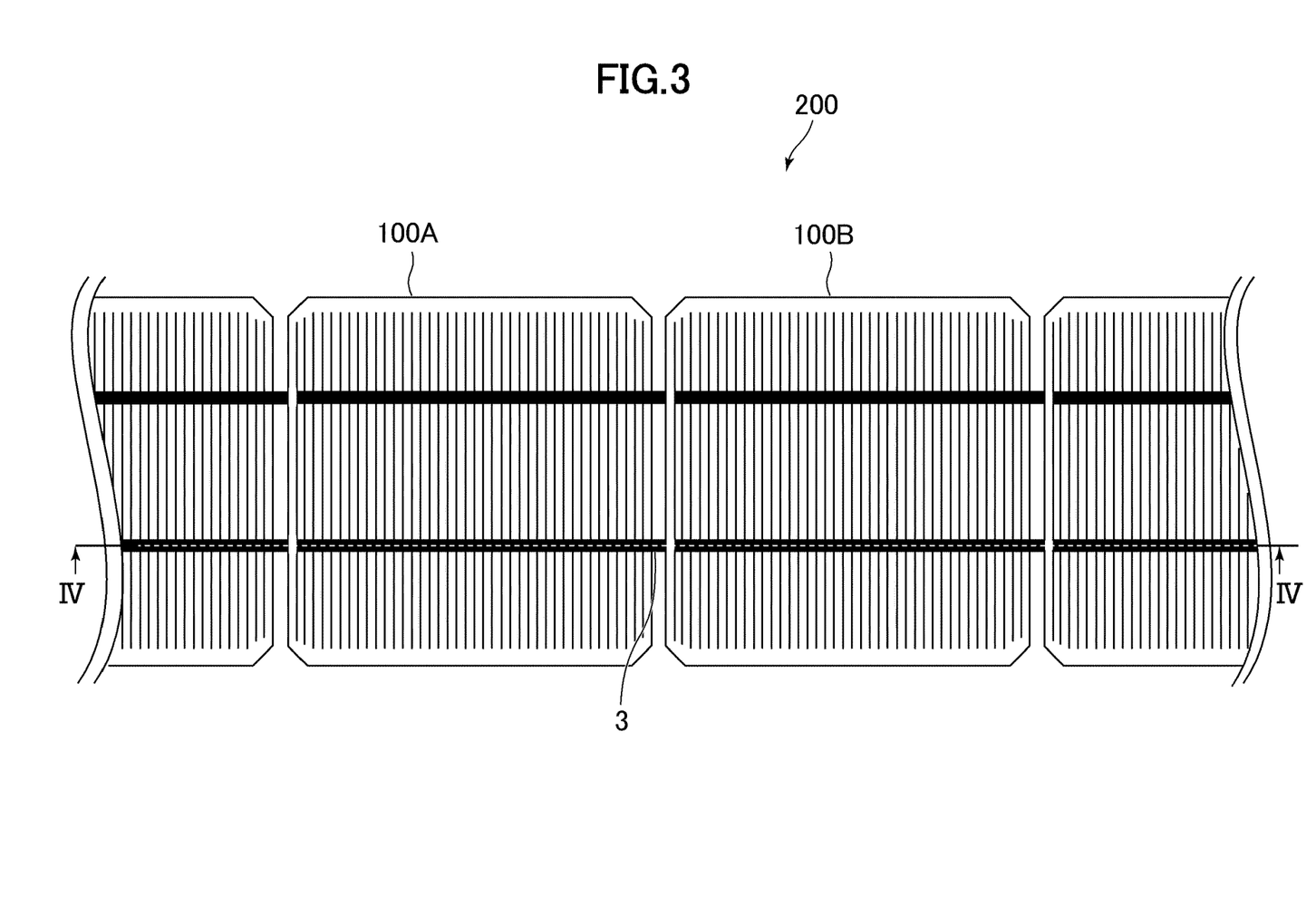
FIG. 3 is a schematic plan view for illustrating a front surface side of the solar cell module according to the embodiment.

FIG. 3 is a schematic plan view for illustrating a front surface side of the solar cell module 200 according to this embodiment.

In this embodiment, the solar cell module 200 includes a first photoelectric conversion element 100A and a second photoelectric conversion element 100B. The first photoelectric conversion element 100A and the second photoelectric conversion element 100B are serially connected to each other with a wiring material 3.

Figure 4:
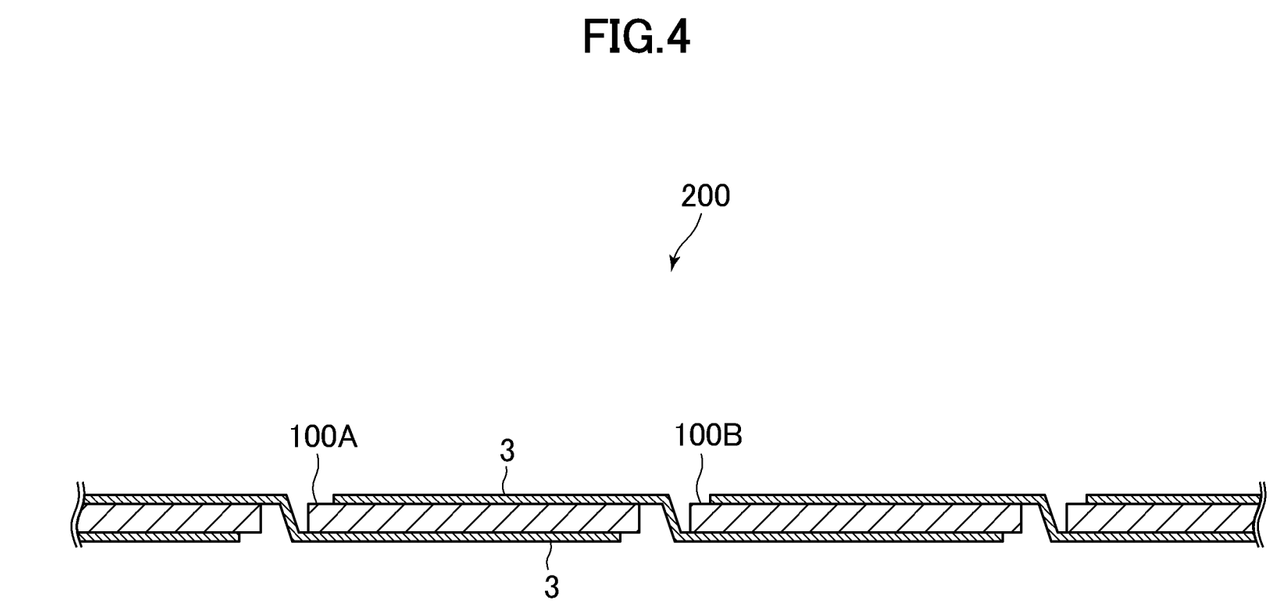
FIG. 4 is a schematic sectional view for illustrating a cross section taken along the line IV-IV of FIG. 3.

FIG. 4 is a schematic sectional view for illustrating a cross section taken along the line IV-IV of FIG. 3. As illustrated in FIG. 4, an approximately half of the wiring material 3 in a longitudinal direction is connected to a front surface side of the bus bar electrode 2A on a light-receiving surface side of the first photoelectric conversion element 100A, and another approximately half of the wiring material 3 in the longitudinal direction is connected to a back surface side of the bus bar electrode 2A on a back surface side of the second photoelectric conversion element 100B adjacent to the first photoelectric conversion element 100A. In this way, a plurality of photoelectric conversion elements 100 adjacent to each other are serially connected to each other with the wiring materials 3 to form a so-called solar cell string.

Figure 5:
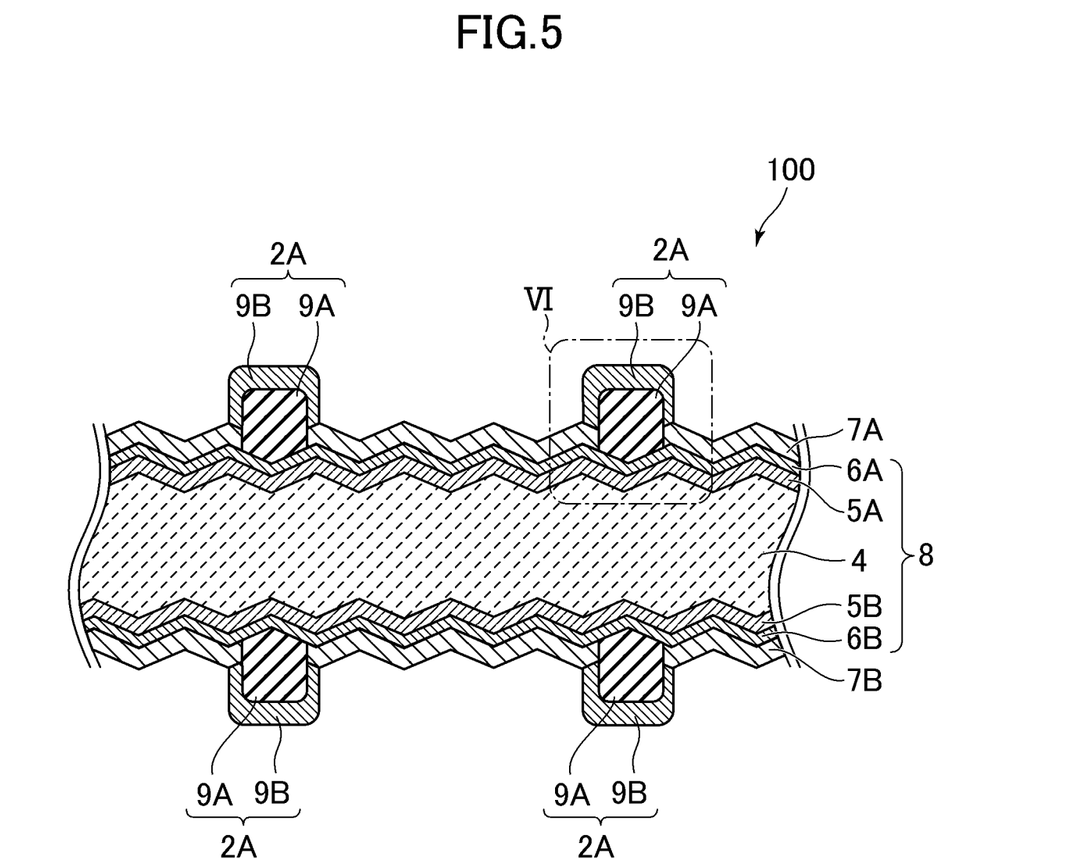
FIG. 5 is a schematic sectional view for illustrating a cross section taken along the line V-V of FIG. 1.

FIG. 5 is a schematic sectional view for illustrating a cross section taken along the line V-V of FIG. 1. In addition, FIG. 6 is an enlarged schematic sectional view of a portion VI of FIG. 5.

Figure 6:
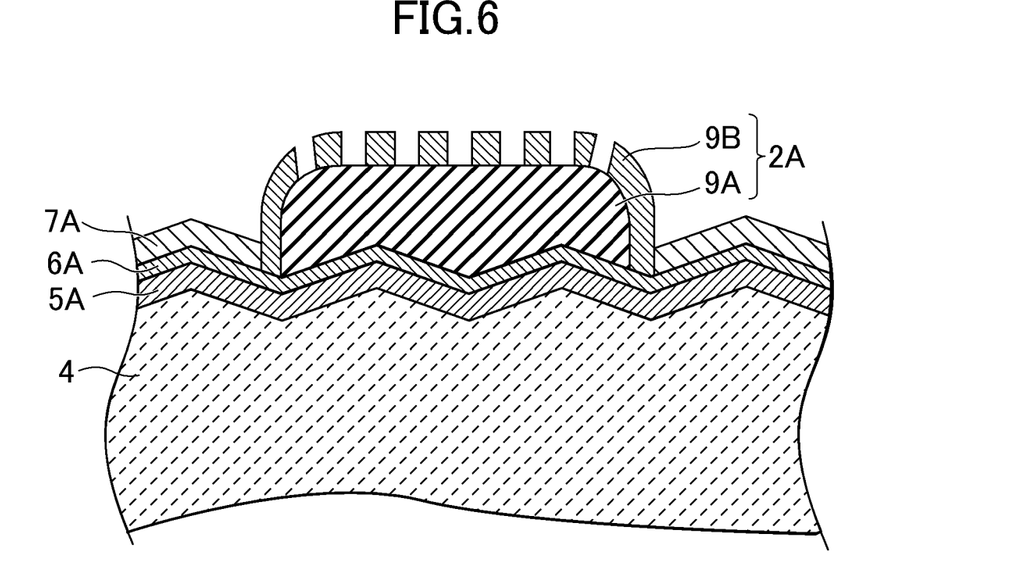
FIG. 6 is an enlarged schematic sectional view of a portion VI of FIG. 5.

As illustrated in FIG. 5 and FIG. 6, the photoelectric converter 8 includes a semiconductor substrate 4 formed of, for example, monocrystalline silicon or polycrystalline silicon. The photoelectric converter 8 includes a first amorphous semiconductor layer 5A and a first transparent conductive layer 6A formed on a front surface side (light-receiving surface side) of the semiconductor substrate 4, and a second amorphous semiconductor layer 5B and a second transparent conductive layer 6B formed on a back surface side of the semiconductor substrate 4.

The above-mentioned bus bar electrodes 2A are formed on the front surface side and the back surface side of the photoelectric converter 8. The bus bar electrodes 2A each include: a first electrode film 9A serving as a base electrode formed on a front surface or a back surface of the photoelectric converter 8; and a second electrode film 9B serving as a plating electrode formed on the base electrode. That is, in the collector electrode 2, the first electrode film 9A is arranged on a photoelectric converter 8 side and the second electrode film 9B is arranged on a wiring material 3 side.

The first electrode film 9A is formed by screen printing a conductive paste containing conductive particles, a thermosetting resin, and a solvent. In this embodiment, the first electrode film 9A is formed by screen printing a silver paste. The first electrode film 9A functions as a base electrode at the time of forming the second electrode film 9B described below by a plating method. In the present disclosure, a case of having a volume resistivity of $10^{-2}$ Ω·cm or less is defined as being conductive. In addition, a case of having a volume resistivity of $10^2$Ω·cm or more is defined as being insulative. For example, silver, copper, aluminum, nickel, tin, bismuth, zinc, gallium, carbon, or a mixture thereof may be used as the conductive particles. An epoxy-based resin, a phenol-based resin, an acrylic resin, or the like may be used as the thermosetting resin.

The second electrode film 9B is formed by depositing a metal from the first electrode film 9A as a starting point by a plating method. For example, copper, nickel, tin, aluminum, chromium, or silver may be used as the metal to be deposited as the second electrode film 9B, and the metal may be any material that can be formed by the plating method.

As illustrated in FIG. 6, the second electrode film 9B is formed partially on the first electrode film 9A. Specifically, when the bus bar electrode 2A is microscopically observed in a direction in which the semiconductor substrate 4 is planarly viewed, there exist a region in which the second electrode film 9B is formed and a region in which part of a surface of the first electrode film 9A on at least the wiring material 3 side is exposed from the second electrode film 9B.

As illustrated in FIG. 5, a first insulating film 7A and a second insulating film 7B are formed in a front surface region and a back surface region of the photoelectric converter 8 in each of which the first electrode film 9A is prevented from being formed. When the first insulating film 7A and the second insulating film 7B are formed, the photoelectric converter 8 can be chemically and electrically protected from a plating liquid in the above-mentioned plating method for forming the second electrode film 9B.

Figure 7:
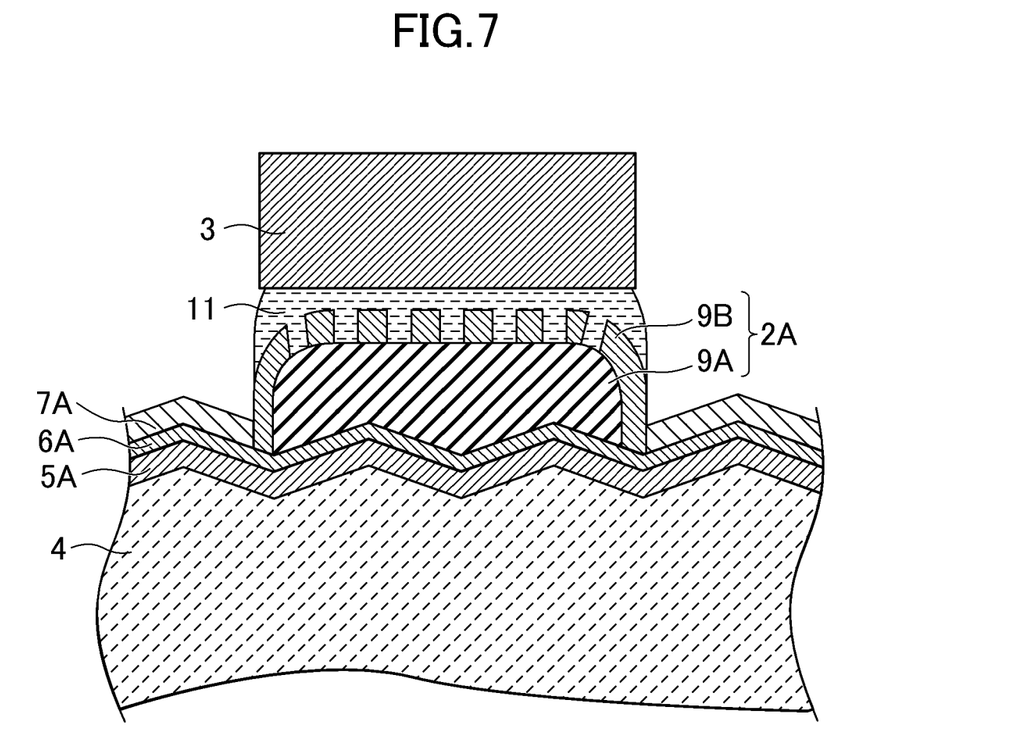
FIG. 7 is an enlarged schematic sectional view of the solar cell module according to the embodiment.

FIG. 7 is an enlarged schematic sectional view of the solar cell module 200 according to this embodiment in a state in which the wiring material 3 is connected to the front surface side of the bus bar electrode 2A on the light-receiving surface side.

As illustrated in FIG. 7, a solder 11 intermediates between the bus bar electrode 2A and the wiring material 3, and thus the bus bar electrode 2A and the wiring material 3 are electrically connected to each other with the solder 11. The solder 11 is directly connected to an exposed surface of the second electrode film 9B and the surface of the first electrode film 9A exposed from the second electrode film 9B.

As a specific configuration in which the part of the first electrode film 9A is exposed from the second electrode film 9B, there may be given, for example, a configuration in which the second electrode film 9B is partially formed in a plurality of island shapes on the surface of the first electrode film 9A on the wiring material 3 side. In this case, the solder 11 is connected to the surface of the second electrode film 9B including not only an upper surface of the second electrode film 9B but also a side surface of the second electrode film 9B formed in the plurality of island shapes.

When such configuration is adopted, the solder 11 is connected not only to the upper surface of the second electrode film 9B but also to the side surface of the second electrode film 9B formed in the plurality of island shapes, and hence a strong adhesion property by virtue of an anchor effect can be expected. As a result, an improvement in connection reliability between the wiring material 3 and the bus bar electrode 2A can be achieved.

Figure 8:
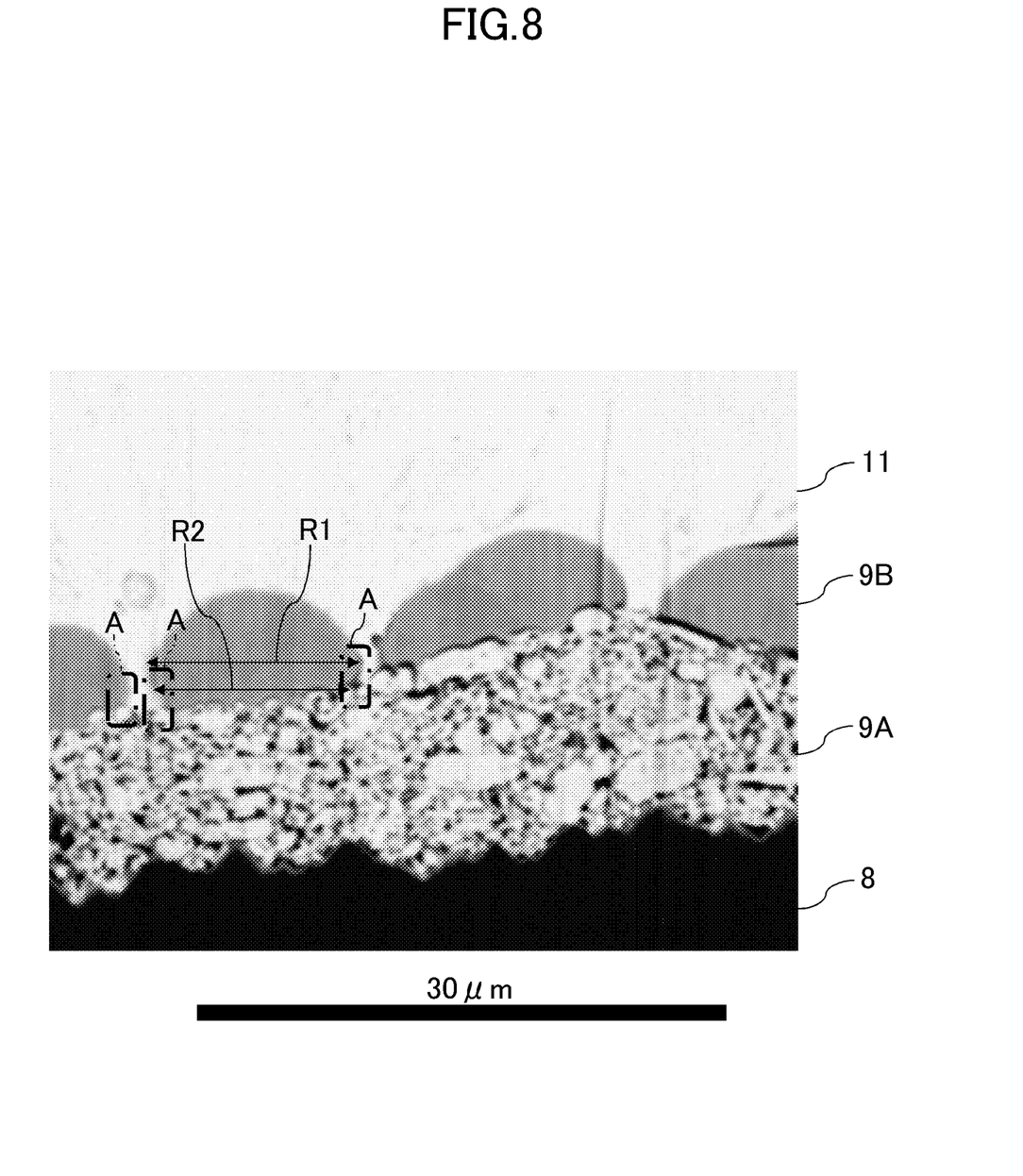
FIG. 8 is a SEM photograph for showing a cross section in the vicinity of a first electrode film and a second electrode film of the solar cell module according to the embodiment.

FIG. 8 is a SEM photograph for showing a cross section in the vicinity of the first electrode film 9A and the second electrode film 9B of the solar cell module 200 according to this embodiment. As shown in FIG. 8, the second electrode film 9B has a shape close to a dome shape, and has a portion in which the diameter of the second electrode film 9B in a direction parallel to the semiconductor substrate 4 is reduced as approaching the first electrode film 9A. That is, the second electrode film 9B has a configuration of having a diameter R2 smaller than a maximum diameter R1 in the direction parallel to the semiconductor substrate 4 on a first electrode film 9A side with respect to the maximum diameter R1. Therefore, there is achieved a configuration in which, in a peripheral region of the second electrode film 9B, the solder 11 intermediates between the second electrode film 9B and the first electrode film 9A in a peripheral region A in the vicinity of the diameter R2. That is, in the peripheral region A, there exists a portion in which the first electrode film 9A, the solder 11, and the second electrode film 9B are arranged in the stated order in a direction perpendicular to the semiconductor substrate 4 from a semiconductor substrate 4 side. Such peripheral region A improves an anchor effect between the solder 11 and the second electrode film 9B.

As another specific configuration in which the part of the first electrode film 9A is exposed from the second electrode film 9B, there may be given, for example, a configuration in which the second electrode film 9B has an opening configured to expose the part of the surface of the first electrode film 9A on at least the wiring material 3 side. In this case, the solder 11 is connected not only to an upper surface of the second electrode film 9B but also to an inside of the opening formed in the second electrode film 9B.

When such configuration is adopted, the solder 11 is connected not only to the upper surface of the second electrode film 9B but also to the inside of the opening of the second electrode film 9B, and hence a strong adhesion property by virtue of an anchor effect can be expected. As a result, an improvement in connection reliability between the wiring material 3 and the bus bar electrode 2A can be achieved.

Further, when the first electrode film 9A serving as a base electrode is formed by using the conductive paste, the surface of the first electrode film 9A can be made porous, and hence the wettability of the solder 11 can be improved. As a result, connection reliability between the solder 11 and the first electrode film 9A is improved, and connection reliability between the second electrode film 9B sandwiched there between and the first electrode film 9A can also be improved.

[Method of Manufacturing Solar Cell Module 200]

A method of manufacturing the solar cell module 200 of the present disclosure is described below with reference to FIG. 5, FIG. 6, and FIG. 7.

[Photoelectric Converter Preparing Step]

As illustrated in FIG. 5, the photoelectric converter 8 including: the semiconductor substrate 4 formed of, for example, crystalline silicon, such as monocrystalline silicon or polycrystalline silicon; the first amorphous semiconductor layer 5A and the first transparent conductive layer 6A formed on the front surface side of the semiconductor substrate 4; and the second amorphous semiconductor layer 5B and the second transparent conductive layer 6B formed on the back surface side of the semiconductor substrate 4 is prepared.

When a monocrystalline silicon substrate is used as the semiconductor substrate 4, an impurity configured to supply a charge to silicon is incorporated therein in order to impart conductivity. Specific examples of such monocrystalline silicon substrate include: an n-type substrate in which an atom (e.g., phosphorus) for introducing an electron into a silicon atom is incorporated; and a p-type substrate in which an atom (e.g., boron) for introducing a hole into a silicon atom is incorporated. When a hole and an electron are compared, the electron, which has a smaller effective mass and a smaller scattering cross sectional area, generally has a higher mobility. From the foregoing viewpoint, itis desired to use the n-type monocrystalline silicon substrate as the semiconductor substrate 4.

The first amorphous semiconductor layer 5A is formed on the front surface side of the semiconductor substrate 4. In this embodiment, a description is given of an example in which the first amorphous semiconductor layer 5A is a semiconductor layer including an intrinsic amorphous semiconductor layer and a p-type amorphous semiconductor layer laminated on each other in the state order from the semiconductor substrate 4 side. Examples of the amorphous semiconductor layer include amorphous silicon, amorphous germanium, and amorphous silicon germanium. The amorphous semiconductor includes anamorphous semiconductor, and in addition, also includes a partially crystallized amorphous semiconductor. As a dopant impurity for the p-type amorphous semiconductor layer, B (boron) or the like may be used.

A film forming method for the first amorphous semiconductor layer 5A is not particularly limited, but for example, a chemical vapor deposition method (CVD method) may be used. When the CVD method is used, a $SiH_4$ gas and a $H_2$ gas are used, and $B_2H_6$ diluted with hydrogen is preferably used as a dopant addition gas. The addition amount of the dopant impurity may be a slight amount, and hence it is preferred to use a mixed gas diluted with $SiH_4$ or $H_2$ in advance. It is also appropriate to add a gas containing a dissimilar element, such as $CH_4$, $CO_2$, $NH_3$, or $GeH_4$, at the time of film forming of the first amorphous semiconductor layer 5A to alloy a silicon-based thin film, to thereby change the energy gap of the silicon-based thin film. In addition, it is also appropriate to add a slight amount of an impurity, such as oxygen or carbon, in order to increase light transmissivity. In this case, the first amorphous semiconductor layer 5A may be formed by introducing a gas, such as $CO_2$ or $CH_4$, at the time of film forming by the CVD method.

The second amorphous semiconductor layer 5B is formed on the back surface side of the semiconductor substrate 4. In this embodiment, a description is given of an example in which the second amorphous semiconductor layer 5B is a semiconductor layer including an intrinsic amorphous semiconductor layer and an n-type amorphous semiconductor layer laminated on each other in the state order from the semiconductor substrate 4 side. Examples of the amorphous semiconductor layer include amorphous silicon, amorphous germanium, and amorphous silicon germanium. The amorphous semiconductor includes anamorphous semiconductor, and in addition, also includes a partially crystallized amorphous semiconductor. As a dopant impurity for the n-type amorphous semiconductor layer, P (phosphorus) or the like may be used.

A film forming method for the second amorphous semiconductor layer 5B is not particularly limited, but for example, the CVD method may be used. When the CVD method is used, a $SiH_4$ gas and a $H_2$ gas are used, and $PH_3$ diluted with hydrogen is preferably used as a dopant addition gas. The addition amount of the dopant impurity may be a slight amount, and hence it is preferred to use a mixed gas diluted with $SiH_4$ or $H_2$ in advance. It is also appropriate to add a gas containing a dissimilar element, such as $CH_4$, $CO_2$, $NH_3$, or $GeH_4$, at the time of film forming of the second amorphous semiconductor layer 5B to alloy a silicon-based thin film, to thereby change the energy gap of the silicon-based thin film. In addition, it is also appropriate to add a slight amount of an impurity, such as oxygen or carbon, in order to increase light transmissivity. In this case, the second amorphous semiconductor layer 5B may be formed by introducing a gas, such as $CO_2$ or $CH_4$, at the time of film forming by the CVD method.

In this embodiment, when the semiconductor substrate 4 is of an n type, a PN junction is formed at an interface portion between the semiconductor substrate 4 and the first amorphous semiconductor layer 5A, and when the semiconductor substrate 4 is of a p type, a PN junction is formed at an interface portion between the semiconductor substrate 4 and the second amorphous semiconductor layer 5B.

In this embodiment, the first transparent conductive layer 6A is formed on the front surface side of the first amorphous semiconductor layer 5A, and the second transparent conductive layer 6B is formed on the back surface side of the second amorphous semiconductor layer 5B.

Film forming methods for the first transparent conductive layer 6A and the second transparent conductive layer 6B are not particularly limited, but for example, a physical vapor deposition method, such as a sputtering method, or a chemical vapor deposition (MOCVD) method utilizing a reaction between an organic metal compound and oxygen or water is preferred. In each of the film forming methods, heat or energy from plasma discharge may be utilized.

A transparent conductive metal oxide, such as indium oxide, zinc oxide, tin oxide, titanium oxide, or a complex oxide thereof, may be used as materials for forming the first transparent conductive layer 6A and the second transparent conductive layer 6B. In addition, a non-metal transparent conductive material, such as graphene, may also be used. Out of the above-mentioned materials for forming the first transparent conductive layer 6A and the second transparent conductive layer 6B, it is preferred to use an indium-based complex oxide containing indium oxide as a main component for the first transparent conductive layer 6A and the second transparent conductive layer 6B from the viewpoints of high conductivity and transparency. In addition, it is more preferred to use indium oxide having added thereto a dopant in order to ensure reliability and higher conductivity. As an impurity to be used as the dopant, there is given, for example, Sn, W, Ce, Zn, As, Al, Si, S, and Ti.

[First Electrode Film Forming Step]

Next, as illustrated in FIG. 5, the first electrode film 9A including the conductive particles, the thermosetting resin, and the solvent is formed on the front surface side of the photoelectric converter 8. The first electrode film 9A functions as a conductive base layer at the time of forming the second electrode film 9B described below by a plating process. In this embodiment, the first electrode film 9A is formed also on the back surface side of the photoelectric converter 8.

The first electrode film 9A may be formed by, for example, an inkjet method, a screen printing method, a spray method, or a roll coating method. The first electrode film 9A can be patterned in a predetermined shape. When the patterned first electrode film 9A is formed, a screen printing method is suitable from the viewpoint of productivity. As the screen printing method, a method involving printing a printing paste containing conductive fine particles through use of a screen printing plate having an opening pattern corresponding to the pattern shape of the collector electrode 2 is preferably used.

The first electrode film 9A may be formed of a plurality of layers. For example, when the first electrode film 9A has a structure including a lower layer having low contact resistance to the first transparent conductive layer 6A or the second transparent conductive layer 6B, an improvement in fill factor of the photoelectric conversion element 100 can be expected.

For example, silver, copper, aluminum, nickel, tin, bismuth, zinc, gallium, carbon, or a mixture thereof may be used as the conductive particles included in the first electrode film 9A.

An epoxy-based resin, a phenol-based resin, an acrylic resin, or the like may be used as the thermosetting resin included in the first electrode film 9A. When the thermosetting resin is incorporated in the first electrode film 9A, the first electrode film 9A can be cured through a thermal curing step.

In this embodiment, the first electrode film 9A is formed by screen printing a silver paste. At this time, the thickness of the first electrode film 9A is brought into a non-uniform state by controlling the thickness of the first electrode film 9A through utilization of a mesh used for the screen printing.

[Drying Step]

Next, a drying step of drying the first electrode film 9A is performed. In performing the drying step, the first electrode film 9A is heated, but is dried at a temperature equal to or lower than the curing temperature of the thermo setting resin. Further, the first electrode film 9A is preferably dried at a temperature equal to or higher than the boiling point of the solvent included in the first electrode film 9A. In this embodiment, the drying step is performed by causing the photoelectric converter 8 having formed thereon the first electrode film 9A to pass through a tunnel-shaped heating furnace adjusted to a temperature equal to or lower than the curing temperature of the thermo setting resin. In the drying step, the solvent included in the first electrode film 9A is evaporated.

[First Insulating Film and Second Insulating Film Forming Step]

Next, as illustrated in FIG. 5, the first insulating film 7A and the second insulating film 7B are formed in the front surface region and the back surface region of the photoelectric converter 8 in each of which the first electrode film 9A is prevented from being formed. When the first insulating film 7A and the second insulating film 7B are formed, the front surface and back surface of the photo electric converter 8 can be chemically and electrically protected from a plating liquid in a second electrode film forming step described below.

In addition, in this embodiment, a configuration in which the photoelectric converter 8 includes the first transparent conductive layer 6A and the second transparent conductive layer 6B on the front surface and the back surface thereof, respectively, is adopted. Therefore, when the first insulating film 7A is formed on the entire exposed surface of the first transparent conductive layer 6A, and the second insulating film 7B is formed on the entire exposed surface of the second transparent conductive layer 6B, deposition of a metal on the surfaces of the first transparent conductive layer 6A and the second transparent conductive layer 6B can be suppressed.

It is required to use a material showing electrical insulating properties as materials for forming the first insulating film 7A and the second insulating film 7B, and a material having chemical stability for the plating liquid is desired. When a material having high chemical stability for the plating liquid is used, the first insulating film 7A and the second insulating film 7B are less liable to be dissolved in the second electrode film forming step described below, and occurrence of damage on the front surface and back surface of the photoelectric converter 8 can be suppressed.

In addition, the materials for forming the first insulating film 7A and the second insulating film 7B each preferably have high adhesion strength to the photoelectric converter 8. In this embodiment, the photoelectric converter 8 includes the first transparent conductive layer 6A and the second transparent conductive layer 6B as outermost layers thereof, and hence it is preferred to use materials having high adhesion strength to the first transparent conductive layer 6A and the second transparent conductive layer 6B as the materials for forming the first insulating film 7A and the second insulating film 7B. When the adhesion strength between the first transparent conductive layer 6A and the first insulating film 7A and the adhesion strength between the second transparent conductive layer 6B and the second insulating film 7B are increased, the first insulating film 7A and the second insulating film 7B are less liable to be peeled off in the second electrode film forming step described below, and deposition of a metal on the first transparent conductive layer 6A and the second transparent conductive layer 6B can be suppressed.

For each of the first insulating film 7A and the second insulating film 7B, it is preferred to use a material having high light transmissivity in a range of wavelengths that the photoelectric converter 8 can absorb. The first insulating film 7A and the second insulating film 7B are formed also on the light-receiving surface side of the photoelectric converter 8, and hence when the first insulating film 7A and the second insulating film 7B exhibit small light absorption, a larger amount of light can be taken in the photo electric converter 8. For example, when the first insulating film 7A and the second insulating film 7B each have such sufficient transparency as a transmissivity of 90% or more, an optical loss caused by light absorption in the first insulating film 7A and the second insulating film 7B is reduced. As a result, a step of removing the first insulating film 7A and the second insulating film 7B is not required after the second electrode film forming step, and the first insulating film 7A and the second insulating film 7B may be directly used as part of the photoelectric conversion element 100. Therefore, the manufacturing steps for the photoelectric conversion element 100 can be simplified, and the productivity can be further increased. In addition, when the step of removing the first insulating film 7A and the second insulating film 7B is not provided and the first insulating film 7A and the second insulating film 7B are directly used as part of the photoelectric conversion element 100, for each of the first insulating film 7A and the second insulating film 7B, it is more desired to use a material having sufficient weather resistance and stability to heat and humidity in addition to the highlight transmissivity in the range of wavelengths that the photoelectric converter 8 can absorb.

The materials for forming the first insulating film 7A and the second insulating film 7B may each be an inorganic insulating material or an organic insulating material. A material, such as silicon oxide, silicon nitride, titanium oxide, aluminum oxide, or magnesium oxide, may be used as the inorganic insulating material. A material, such as polyester, an ethylene-vinyl acetate copolymer, acryl, epoxy, or polyurethane, may be used as the organic insulating material.

Of such inorganic materials, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, titanium oxide, and strontium titanate, and the like are preferably used from the viewpoints of plating liquid resistance and transparency. Of those, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, and the like are preferred from the viewpoints of, for example, electrical characteristic and adhesiveness to a transparent electrode layer, and silicon oxide, silicon nitride, and the like are particularly preferably used from the viewpoint of appropriately adjusting the refractive index. Those inorganic materials are not limited to materials each having a stoichiometric composition, and materials each including an oxygen defect or the like may be adopted.

In addition, when the optical characteristics and the thicknesses of the first insulating film 7A and the second insulating film 7B are appropriately set, light reflection characteristics can be improved to increase a light amount introduced into an inside of the photoelectric converter 8, to thereby further improve conversion efficiency. In order to obtain such effect, the refractive indices of the first insulating film 7A and the second insulating film 7B are preferably lower than the refractive index of the surface of the photoelectric converter 8. In addition, from the viewpoint of imparting suitable antireflection characteristics to the first insulating film 7A and the second insulating film 7B, the thicknesses are each set to preferably 20 nm or more, more preferably 50 nm or more.

When the inorganic insulating material, such as silicon oxide or silicon nitride, is used as the materials for forming the first insulating film 7A and the second insulating film 7B, a dry method, such as a plasma CVD method or a sputtering method, is preferably used as forming methods for the first insulating film 7A and the second insulating film 7B. In addition, when the organic insulating material is used as the materials for forming the first insulating film 7A and the second insulating film 7B, a wet method, such as a spin coating method or a screen printing method, is preferably used as forming methods for the first insulating film 7A and the second insulating film 7B. According to those methods, a film having a dense structure with few defects, such as pin holes, can be formed.

In the present disclosure, a temperature at the time of forming the first insulating film 7A and the second insulating film 7B is not particularly limited, but from the viewpoint of improving thickness uniformity, the films are preferably formed while being heated. In addition, the temperature at the time of forming the first insulating film 7A and the second insulating film 7B is preferably set to a temperature lower than the temperature limit of the photoelectric converter 8. As described in this embodiment, when the photoelectric converter 8 includes the first amorphous semiconductor layer 5A, the second amorphous semiconductor layer 5B, the first transparent conductive layer 6A, and the second transparent conductive layer 6B, the first insulating film 7A and the second insulating film 7B are preferably formed at 250° C. or less.

In this embodiment, the first insulating film 7A and the second insulating film 7B are formed by a plasma CVD method from the viewpoint of forming films each having a denser structure. By the plasma CVD method, when the first insulating film 7A and the second insulating film 7B are formed in a thick film having a thickness of about 200 nm or even in a thin film having a thickness of from about 30 nm to about 100 nm, films each having a highly dense structure can be formed.

Also in the first insulating film 7A and second insulating film 7B forming step, the thermosetting resin included in the first electrode film 9A is in an uncured state.

[Thermal Curing Step]

Next, a thermal curing step of thermally curing the first electrode film 9A at a temperature equal to or higher than the curing temperature of the thermosetting resin is performed. Through the thermal curing step, the thermosetting resin in the first electrode film 9A is cured, and the conductive particles formed of silver or the like are fused. Through the thermal curing step, the conductivity of the first electrode film 9A illustrated in FIG. 7 is ensured. Even when the first electrode film 9A is coated with the insulating film through the above-mentioned first insulating film and second insulating film forming step, the manufacturing method may include a thermal curing step of shrinking and curing the surface of the first electrode film 9A to expose the first electrode film 9A.

[Second Electrode Film Forming Step]

Next, a second electrode film forming step of forming the second electrode film 9B from the first electrode film 9A as a starting point by a plating method is performed. In this embodiment, the first electrode films 9A are formed on the front surface side and back surface side of the photoelectric converter 8, and hence the second electrode films 9B are formed in first electrode film 9A forming regions on the front surface side of the first insulating film 7A and on the back surface side of the second insulating film 7B. For example, copper, nickel, tin, aluminum, chromium, or silver may be used as a metal to be deposited as the second electrode film 9B, and any material that can be formed by the plating method may be used.

As described in the first electrode film forming step, the thickness of the first electrode film 9A is in anon-uniform state. Therefore, there arise a region on which a plating film is easily formed and a region on which a plating film is hardly formed in a plating process. As a result, as illustrated in FIG. 6, the second electrode film 9B is partially formed on the first electrode film 9A, and thus part of the surface of the first electrode film 9A on at least the wiring material 3 side can be exposed from the second electrode film 9B.

As a specific example in which the part of the first electrode film 9A is exposed from the second electrode film 9B, there may be given, for example, an example in which the second electrode film 9B is partially formed in a plurality of island shapes on the surface of the first electrode film 9A on the wiring material 3 side.

In addition, as another specific example in which the part of the first electrode film 9A is exposed from the second electrode film 9B, there may be given, for example, an example in which the second electrode film 9B is formed so as to have an opening configured to expose the part of the surface of the first electrode film 9A on at least the wiring material 3 side.

In this embodiment, a step of partially forming the second electrode film 9B on the first electrode film 9A by bringing the thickness of the first electrode film 9A into a non-uniform state in the first electrode film forming step is described as an example, but the present invention is not limited to such method. For example, it is also appropriate to adopt a method involving once forming the second electrode film 9B on the entire surface of the first electrode film 9A, and then mechanically roughening the second electrode film 9B to remove part of the second electrode film 9B, to thereby expose the part of the surface of the first electrode film 9A on at least the wiring material 3 side from the second electrode film 9B.

The second electrode film 9B may be formed by an electroless plating method or an electrolytic plating method, but from the viewpoint of productivity, an electrolytic plating method is suitable. By the electrolytic plating method, a metal deposition rate can be increased, and hence the second electrode film 9B can be formed in a short time period.

The second electrode film 9B may be formed of a plurality of layers. For example, when a first second electrode film 9B formed of a highly conductive material, such as copper, is formed on the first electrode film 9A through intermediation of the first insulating film 7A or the second insulating film 7B, and then a second second electrode film 9B excellent in chemical stability is formed on the surface of the first second electrode film 9B, the collector electrode 2 that has low resistance and is excellent in chemical stability can be formed.

[Wiring Material Connecting Step]

Next, as illustrated in FIG. 7, the solder 11 is formed on the bus bar electrode 2A to electrically connect the wiring material 3 and the bus bar electrode 2A to each other. The solder 11 is directly connected to the exposed surface of the second electrode film 9B and to the surface of the first electrode film 9A exposed from the second electrode film 9B.

The solar cell module 200 is manufactured by such process, and thus the connection reliability between the wiring material 3 and the bus bar electrode 2A incorporated in the solar cell module 200 can be improved.

First, when the second electrode film 9B is partially formed in the plurality of island shapes on the surface of the first electrode film 9A on the wiring material 3 side, the solder 11 is connected to the surface of the second electrode film 9B including not only an upper surface of the second electrode film 9B but also a side surface of the second electrode film 9B formed in the plurality of island shapes.

As a result of the connection of the solder 11 not only to the upper surface of the second electrode film 9B but also to the side surface of the second electrode film 9B, a strong adhesion property by virtue of an anchor effect can be expected, and an improvement in connection reliability between the wiring material 3 and the bus bar electrode 2A can be achieved.

Alternatively, when the second electrode film 9B is formed so as to have an opening configured to expose the part of the surface of the first electrode film 9A on at least the wiring material 3 side, the solder 11 is connected not only to an upper surface of the second electrode film 9B but also to an inside of the opening formed in the second electrode film 9B.

As a result of the connection of the solder 11 not only to the upper surface of the second electrode film 9B but also to the inside of the opening of the second electrode film 9B, a strong adhesion property by virtue of an anchor effect can be expected, and an improvement in connection reliability between the wiring material 3 and the bus bar electrode 2A can be achieved.

Further, when the first electrode film 9A serving as a base electrode is formed by using the conductive paste, the surface of the first electrode film 9A can be made porous, and thus the wettability of the solder 11 thereto can be improved. As a result, the connection reliability between the solder 11 and the first electrode film 9A is improved, and the connection reliability between the second electrode film 9B sandwiched therebetween and the first electrode film 9A can also be improved.

The invention claimed is:

1. A solar cell module, comprising:
   a photoelectric converter;
   a collector electrode electrically connected to the photoelectric converter; and
   a wiring material electrically connected to the collector electrode,
   wherein:
      the collector electrode comprises:
         a first electrode film formed on a photoelectric converter side; and
         a second electrode film formed on at least a wiring material side and side surfaces of the first electrode film so that part of a top portion of a surface of the first electrode film on the wiring material side is exposed,
      the collector electrode and the wiring material are electrically connected to each other with solder connected to the part of the surface of the first electrode film exposed from the second electrode film and to a surface of the second electrode film,
      the first electrode film comprises:
         a thermosetting resin, and
         conductive particles,
      the second electrode film comprises a plating electrode, and
      the first electrode film and the second electrode film are made from different materials.

2. The solar cell module according to claim 1,
   wherein the second electrode film is partially formed in a plurality of island shapes on the top portion of the surface of the first electrode film on the wiring material side, and
   wherein the solder is connected to the surface of the second electrode film formed in the plurality of island shapes, the surface including a side surface of the second electrode film.

3. The solar cell module according to claim 1,
   wherein the second electrode film has an opening configured to expose the part of the top portion of the surface of the first electrode film on at least the wiring material side, and
   wherein the solder is connected to an inner surface of the opening.

4. The solar cell module according to claim 1, wherein the top portion of the surface of the first electrode film on at least the wiring material side is porous.

5. The solar cell module according to claim 1, wherein the photoelectric converter includes:
   a semiconductor substrate;
   an amorphous semiconductor layer formed on a collector electrode side of the semiconductor substrate; and
   a transparent conductive layer formed on a collector electrode side of the amorphous semiconductor layer.

6. The solar cell module according to claim 1, wherein the photoelectric converter has formed an insulating film in a surface region thereof on a wiring material side in which the first electrode film is prevented from being formed.

* * * * *